United States Patent [19]
Hopkins, II

[11] Patent Number: 4,746,793
[45] Date of Patent: May 24, 1988

[54] MASK FOR SPECTROPHOTOMETER PHOTODIODE ARRAY HAVING A BRIDGE PORTION THAT SUBSTANTIALLY COVERS EACH PHOTODIODE

[75] Inventor: George W. Hopkins, II, Sunnyvale, Calif.

[73] Assignee: Hewlett-Packard Company, Palo Alto, Calif.

[21] Appl. No.: 905,987

[22] Filed: Sep. 10, 1986

[51] Int. Cl.$^4$ .......................... H01J 5/16; H01J 40/14
[52] U.S. Cl. ................................ 250/237 R; 250/578; 356/326; 356/308
[58] Field of Search ......................... 250/237 R, 578; 356/308, 320, 326, 328

[56] References Cited

U.S. PATENT DOCUMENTS 3,547,542 12/1970 Bulpitt et al. ................. 356/308
4,425,501 1/1984 Stauffer ...................... 250/237 R Primary Examiner—David C. Nelms
Assistant Examiner—William L. Oen
Attorney, Agent, or Firm—Paul L. Hickman

[57] ABSTRACT

A photodiode assembly including a photodiode array having a linear arrangement of photodiodes, and a mask associated with the photodiode array to shade one or more selected photodiodes from incoming light of a particular frequency. The mask includes a frame provided with an elongated slot, and at least one bridge formed across the slot for shading the selected photodiode. The bridge portion is sufficiently wide to fully cover the selected photodiode and to partially cover the two adjacent photodiodes. An aperture is provided through the bridge in alignment with the selected photodiode to allow a portion of the incident light to impinge upon the selected photodiode.

22 Claims, 3 Drawing Sheets

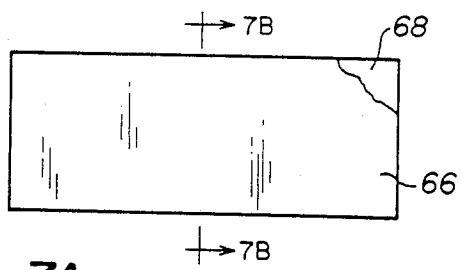
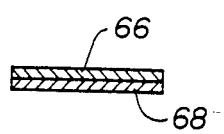
FIG 7A　　　　　　　FIG 7B
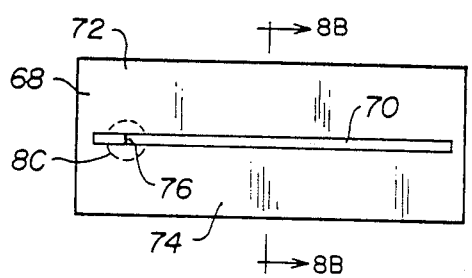
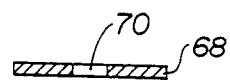
FIG 8A　　　　　　　FIG 8B
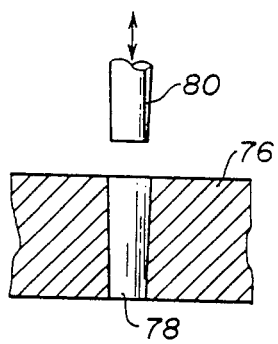
FIG 8C
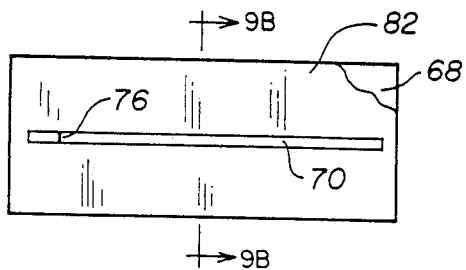
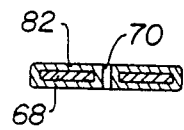
FIG 9A　　　　　　　FIG 9B 4,746,793

MASK FOR SPECTROPHOTOMETER PHOTODIODE ARRAY HAVING A BRIDGE PORTION THAT SUBSTANTIALLY COVERS EACH PHOTODIODE

BACKGROUND OF THE INVENTION

1. Field of the Invention

This invention relates generally to photoelectric detectors, and more particularly to photodiode array assemblies used as detectors in spectrophotometers.

2. Description of the Prior Art

Spectrophotometers are instruments used to determine the chemical make-up of a sample by analyzing the spectral intensities of light directed through the sample. The light is divided into its component parts by the spectrophotometer, which then makes photometric measurements to determine which spectral components of the light source have been absorbed by the sample.

The light can be divided into its component parts by using a variety of devices, such as prisms, diffraction gratings, holograms, etc. The divided light tends to separate into spatially separated spectral bands which are arranged in the order of their frequencies. By analyzing the relative intensities of the spectral bands, the chemical nature of the sample can be deduced.

The intensity of the spectral bands can be measured by moving a photoelectric detector sequentially through the spectral bands, or by causing the spectral bands to move across a fixed detector. However, such methods are slow and requires precision transport mechanisms. A more desirable detector for use in spectrophotometers is a photodiode array comprising several hundred individual photodiodes formed on a common, semiconductor substrate. Each of the photodiodes of the array can correspond to a particular spectral band, allowing the intensities of all of the spectral bands to be measured simultaneously.

A problem with prior art photodiode array spectrophotometers is that a photodiode of the array can be overloaded if a particularly intense spectral band falls upon it. For example, it has been found that the light emitted by a deuterium discharge lamp source has a strong spectral line at 656 nanometers (nm) which can overload the photodiode corresponding to that wavelength and thus the analog-to-digital (A/D) converter which couples the photodiode array to the remainder of the system.

The aforementioned problem has been addressed by the Hewlett-Packard Company of Palo Alto, California with their models HP 8451 and HP 8452 diode array spectrophotometers. The solution with both the HP 8451 and HP 8452 is to apply an opaque mask over the photodiode array to partially shade the photodiodes corresponding to the strong spectral bands.

As will be discussed in greater detail subsequently, the prior art photodiode array masks tend to introduce aberrations in the absorption curve generated by the spectrophotometer. These aberrations have been a persistent problem in the industry. For example, the Hewlett-Packard Company has been shipping spectrophotometers using the prior art photodiode array masks since approximately 1979, and has made continuing efforts to solve the problem of the aberrations caused by the prior art masks. Despite major research efforts by recognized experts in the field of spectrophotometry, the solution to this problem heretobefore eluded discovery.

SUMMARY OF THE INVENTION

A major object of this invention is to provide a mask for a photodiode array which minimizes aberrations in the derived absorbance curve.

Briefly, the mask includes a frame provided with a slot receptive to a linearly arranged a photodiode array, and a bridge portion extending across the slot to shade a selected photodiode corresponding to a strong spectral band. The bridge portion has a lateral dimension which exceeds the lateral dimension of the selected photodiode to partially overlap portions of adjacent photodiodes. An aperture is provided through the bridge portion to permit a portion of the light corresponding to the strong spectral band to impinge upon the selected photodiode.

A major advantage of the present invention is that it greatly decreases aberrations in the absorbance curve caused by photodiode masks of the prior art.

These and other objects and advantages of the present invention will be apparent to those skilled in the art after reading the following descriptions and studying the various figures of the drawing.

BRIEF DESCRIPTION OF THE DRAWINGS

FIGS. 7-9 illustrate a method for making an improved mask in accordance with the present invention, where:

FIG. 7a is a top plan view of a blank frame;

FIG. 7b is a cross-sectional view taken along line 7b—7b of FIG. 7a;

FIG. 8a is a top plan view illustrating a chemical etching step;

FIG. 8b is a cross-section taken along line 8b—8b of FIG. 8a;

FIG. 8c is a cross-section of a portion of FIG. 8a encircled by line 8c which illustrates an EDM machining step;

FIG. 9a is a top plan view illustrating the application of an absorptive coating to the mask; and FIG. 9b is a cross section taken along line 9b-9b of FIG. 9.

DETAILED DESCRIPTION OF THE PREFERRED EMBODIMENT(S)

Figure 1:
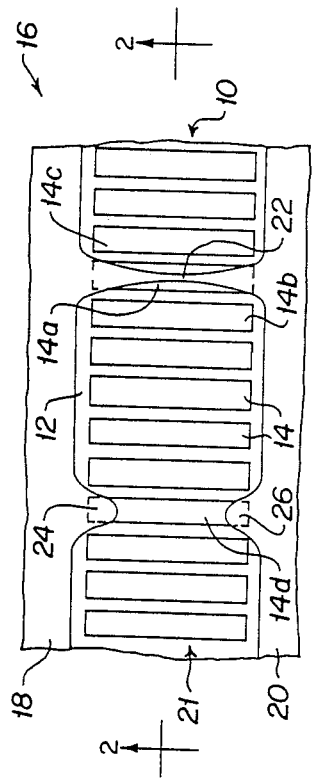
FIG. 1 is a top plan view of a prior art photodiode array and mask assembly.

In FIG. 1 a prior art photodiode array and mask assembly includes a photodiode array 10 having a substrate 12 and a plurality of linearly arranged photodiodes 14, and an opaque mask 16. The mask 16 includes a pair of frame portions 18 and 20 flanking a slot 21, a bridge portion 22 extending across slot 21, and protuberances 24 and 26 extending into slot 21.

During operation of the prior art spectrophotometer, sampled light source is split into a large number of spectral bands, at least some of which are focussed on individual photodiodes 14. For example, a narrow bandwidth of frequencies around 656 nm can be focused on a photodiode 14a, while a narrow bandwidth of frequencies around 654 nm and 658 nm can be focused on photodiodes 14b and 14c, respectively.

In this prior art solution, the bridge portion 22 of mask 16 partially shades photodiode 14a from light at 656 nm. Likewise, protuberances 24 and 26 partially shield a photodiode 14d from a portion of the incident light at a different frequency. By reducing the amount of light impinging on photodiodes exposed to light corresponding to strong spectral bands, the A/D converters which are connected to the photodiode array 10 are not overloaded. Unfortunately, it has been found that masking portions of individual photodiodes in a photodiode array can cause the aforementioned unwanted aberrations in the absorbance waveform.

Figure 2:
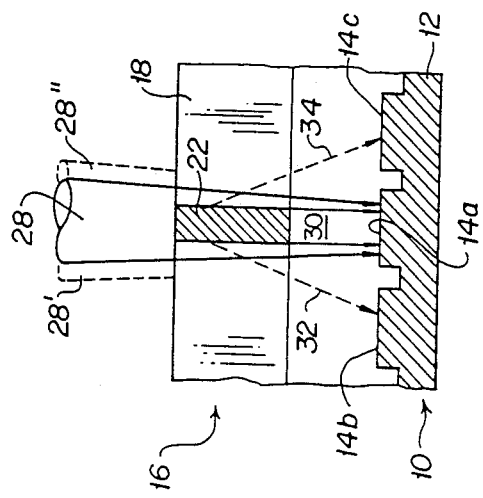
FIG. 2 is a partial cross-sectional view of the prior art assembly which is taken along line 2—2 of FIG. 1.

With reference to FIG. 2, the aberrations produced by the prior art solution is believed to be caused, in part, by the reflection of light from the sides of the bridge portion 22 onto adjacent photodiodes. More specifically, a focused beam of light representing the spectral band centered at 656 nm is focused on photodiode 14a. The narrow bridge 22 partially shades photodiode 14a to produce a penumbra 30 over the majority of the surface of photodiode 14a. However, a portion of light 28 is reflected from the sides from bridge portion 22 as indicated by arrows 32 and 34. If the beam of light 28 shifts as indicated at 28' or 28'' due to temperature fluctuations or other factors, the reflections 32 and 34 to adjacent photodiodes 14b and 14c, respectively, can be even more pronounced.

Figure 3:
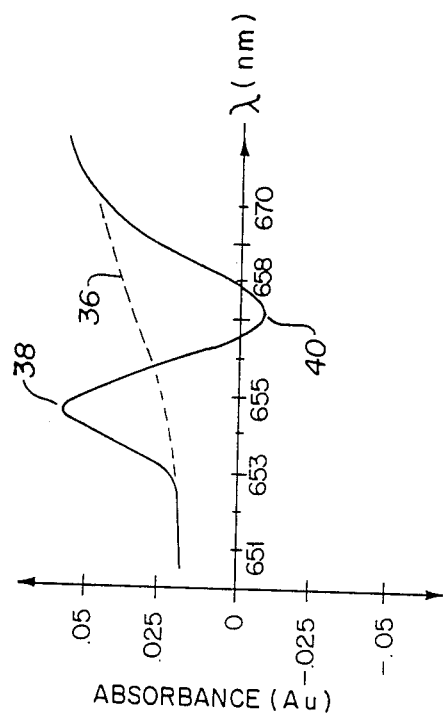
FIG. 3 is a diagram illustrating the absorbance curve produced by the prior art assembly of FIG. 1.

The result of the reflection off of the sides of bridge 22 with the prior art mask 16 can be seen in the absorbance waveform shown in FIG. 3. A smooth absorbance curve 36 is indicated in broken lines. The actual absorbance curve has a pair symmetrical pair of aberrations 38 and 40 centered around 656 nm. The aberrations 38 and 40 appear to be the derivatives of a delta function occurring at 656 nm.

Figure 4:
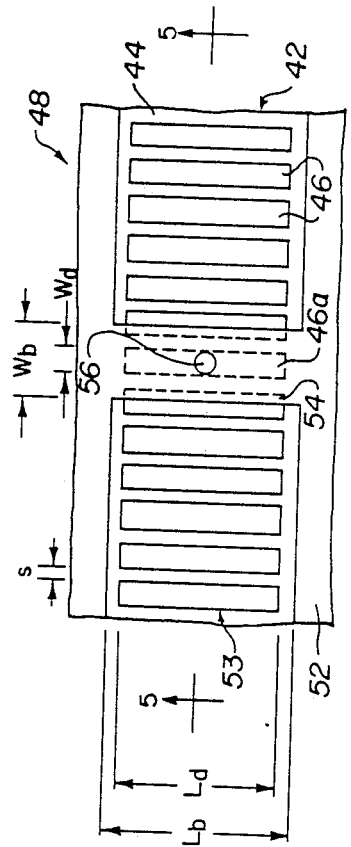
FIG. 4 is a top plan view of an improved photodiode array and mask assembly in accordance with the present invention.

Referring to FIG. 4, a photodiode array 42 in accordance with the present invention includes a substrate 44 and a number of photodiodes 46. A mask 48 in accordance with the present invention includes a pair of frame portions 50 and 52 flanking a slot 53, and a bridge portion 54 extending over the slot 53. An aperture 56 is provided through bridge 54 in alignment with a photodiode 46a.

Figure 5:
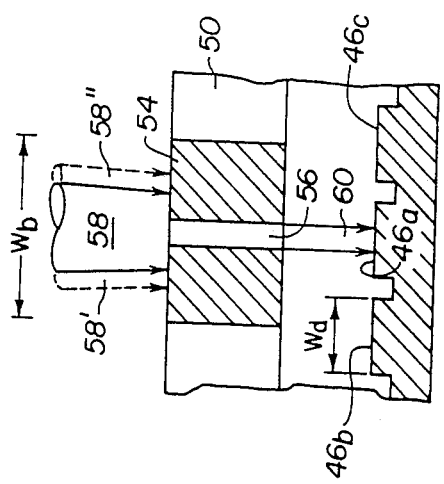
FIG. 5 is a partial cross-sectional view taken along 5—5 of FIG. 4.

With additional reference to the cross-sectional view of FIG. 5, the width $W_b$ of bridge portion 54 is greater than the width $W_d$ of the photodiodes 46. Also, the length $L_b$ of bridge 54 is greater than the length $L_d$ of the photodiodes 46. In consequence, photodiode 46a is substantially completely covered, with the exception of a small area beneath aperture 56.

Furthermore, the lateral width $W_b$ of bridge 54 is sufficiently large to cover portions of adjacent photodiodes 46b and 46c. In other words, the width $W_b$ of the bridge 54 is greater than the sum of the lateral widths $W_d$ of the photodiodes 46 and twice the lateral separation "s" between adjacent photodiodes 46.

Referring now more particularly to FIG. 5, when a beam of light 58 corresponding to a particular spectral band (for example, 656 nm) impinges upon bridge 54, the photodiode 46a is substantially completely shaded from the light 58 with the exception of a small portion 60 of the beam of light 58 which travels through aperture 56. It should be noted that adjacent photodiodes 46b and 46c are substantially completely shaded from beam 58 due to the lateral extension of bridge 54. Furthermore, the 656 nm spectral band is blocked from the adjacent photodiodes even if light 58 shifts slightly laterally as indicated at 58' and 58''.

It should also be noted that the cross-section of the aperture 56 does not have to be round but can be of virtually any shape which permits the desired amount of light to impinge upon the photodiode 46a. Furthermore, it may be desirable in some circumstances to provide more than one aperture 56 through the bridge 54.

Figure 6:
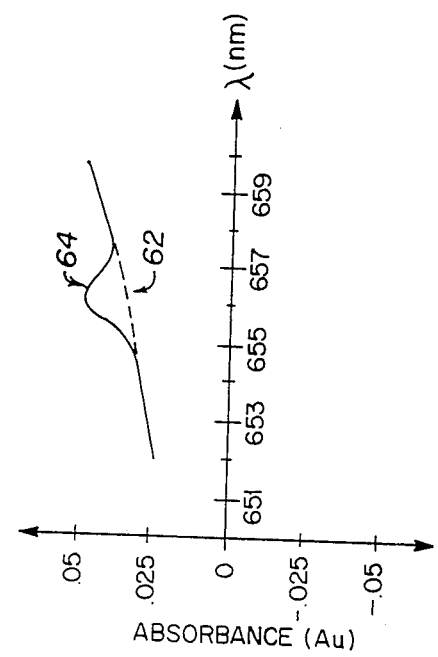
FIG. 6 is a diagram illustrating the absorbance characteristics of the photodiode array and mask assembly of FIG. 4.

With the photodiode array and mask assembly shown in FIGS. 4 and 5, the absorbance waveform as illustrated in FIG. 6 is much improved. A smooth absorbance curve 62 is illustrated in broken line, while the actual absorbance curve is indicated in a solid line. While the absorbance curve still includes a small aberration 64 centered around 656 nm, it is much smaller than the aberrations of the prior art. Furthermore, the aberration 64 takes the form of a delta function, rather than the form of the highly disruptive derivative of a delta function as experienced in the prior art.

A method for producing a photodiode array mask in accordance with the present invention will be discussed with reference to FIGS. 7-9. It should be noted that, by necessity the various figures are not to scale. For example, the thickness of the sections of FIGS. 7-9 have been greatly exaggerated so that various features can be seen.

Referring to FIGS. 7a and 7b, a mask is made by applying a thin layer of photoresist 66 to a metal blank 68. The blank is preferably rectangular in shape, and is typically on the order of 0.05 millimeters thick. The photoresist 66 is then exposed through a patterned reticle, and unwanted portions of the photoresist are removed. The blank 68 is next chemically etched ("milled") through the patterned photoresist layer 66.

FIGS. 8a and 8b illustrate the frame 68 after the photoresist has been removed. The chemical etching produces an elongated slot 70 which essentially divides frame 68 into a pair of frame portions 72 and 74. The chemical etching leaves a bridge portion 76 which extends across slot 70 between frame portions 72 and 74.

FIG. 8c is an enlarged, cross-sectional view of the area encircled by broken line 8c of FIG. 8a. Preferably, aperture 78 is produced with a slightly conical electrode 80 attached to an electric discharge machine (EDM). An electric potential is developed between electrode 80 and bridge portion 76, and the electrode is slowly moved through the bridge portion 76 to form the aperture 78. Alternatively, an aperture through bridge 76 could be produced by the chemical etching which produced the slot 70, although it would be difficult to produce an aperture with a round cross-section by chemical etching methods.

As seen in FIGS. 9a and 9b, after the aperture 78 has been made through the bridge portion 76, an absorptive covering 82 is applied to frame 68 to minimize reflection. The absorptive covering 86 can be applied by any number of coventional techniques, such as painting, anodizing, etc. Finally, the completed mask is applied to a photodiode array such that slot 70 is in alignment with the array and the bridge portion 76 is aligned with a predetermined photodiode of the array.

While this invention has been described with reference to a particular preferred embodiment, it is contemplated that various alterations and permutations of the invention will become apparent to those skilled in the art upon a reading of the preceding descriptions and a study of the drawing. It is therefore intended that the scope of the present invention be determined by the following appended claims.

What is claimed is:

1. A mask for an array of spatially arranged photo-sensitive members, said mask comprising:
   support means; and
   a bridge member coupled to said support means having a lateral dimension greater than a lateral dimension of a selected photo-sensitive member of said array, said bridge member being adapted to shade said selected photo-sensitive member from a majority of the radiation generally impinging on said array.

2. A mask as recited in claim 1 wherein said bridge member is provided with an aperture permitting a portion of said radiation to impinge upon said selected photo-sensitive member.

3. A mask as recited in claim 2 wherein said bridge member is further adapted to shade a photo-sensitive member adjacent said selected photo-sensitive member.

4. A mask as recited in claim 2 wherein said bridge member is further adapted to shade a pair of photo-sensitive members adjacent said selected photo-sensitive member.

5. In a photodiode assembly including a substantially planar array of photodiodes, and a substantially planar photodiode mask juxtaposed with said array of photodiodes; an improved photodiode mask comprising:
   a frame portion provided with a slot adapted to be aligned with said array of photodiodes; and
   a bridge portion extending across said slot to substantially block electromagnetic radiation from impinging upon a selected photodiode, said bridge portion having a lateral dimension which exceeds a lateral dimension of said selected photodiode.

6. A photodiode assembly as recited in claim 5 wherein said bridge portion is provided with an aperture to permit a portion of said electromagnetic radiation to impinge upon said selected photodiode.

7. A photodiode assembly as recited in claim 6 wherein said bridge portion extends laterally over at least a portion of a photodiode which is adjacent to said selected photodiode.

8. A photodiode assembly as recited in claim 6 wherein said bridge portion extends laterally over portions of a pair of photodiodes which are adjacent to said selected photodiode.

9. A photodiode assembly as recited in claim 9 wherein said mask is provided with a surface that is absorptive to electromagnetic radiation.

10. A photodiode assembly comprising:
    a photodiode array including a plurality of photodiodes;
    a photodiode mask associated with said photodiode array, said photodiode mask including a frame portion and at least one bridge portion supported by said frame portion, where said bridge portion substantially covers a selected photodiode by having a transverse dimension that is greater than the transverse dimension of said selected photodiode.

11. A photodiode assembly as recited in claim 10 wherein said bridge portion is provided with an aperture aligned with a portion of said selected photodiode.

12. A photodiode assembly as recited in claim 11 wherein a first lateral edge of said bridge portion covers at least a part of a first photodiode that is adjacent to said selected photodiode.

13. A photodiode assembly as recited in claim 12 wherein a second lateral edge of said bridge portion covers at least a part of a second photodiode that is adjacent to said selected photodiode.

14. A photodiode assembly as recited in claim 11 wherein said frame portion is provided with a slot aligned with said photodiode array.

15. A photodiode assembly as recited in claim 11 wherein said mask is provided with a surface which is adapted to absorb incident electromagnetic radiation.

16. A method for making a mask for a photodiode array comprising:
    producing an elongated slot in a blank such that there is a bridge portion extending across said slot; and
    producing an aperture through said bridge portion.

17. A method as recited in claim 16 wherein said slot is produced by a chemical etching process.

18. A method as recited in claim 17 wherein said chemical etching process includes:
    applying a resist to a surface of said blank;
    exposing said resist with a pattern of radiation;
    developing said resist to remove portions thereof producing a patterned resist layer on said blank;
    chemically etching through said surface of said blank where said resist has been removed; and
    removing the patterned resist layer.

19. A method as recited in claim 18 wherein said aperture is produced by electric discharge machining.

20. A method as recited in claim 16 wherein said aperture is produced by electric discharge machining.

21. A method as recited in claim 16 wherein said aperture is formed by a chemical etching process.

22. A method as recited in claim 17 wherein said aperture is formed by the same chemical etching process which formed said slot.

* * * * *